US011835587B2

(12) United States Patent
Du et al.

(10) Patent No.: US 11,835,587 B2
(45) Date of Patent: Dec. 5, 2023

(54) METHOD FOR DETERMINING FULL-CHARGE CAPACITY OF BATTERY PACK, METHOD FOR DETERMINING STATE OF HEALTH OF BATTERY PACK, SYSTEM, AND APPARATUS

(71) Applicant: CONTEMPORARY AMPEREX TECHNOLOGY CO., LIMITED, Ningde (CN)

(72) Inventors: Mingshu Du, Ningde (CN); Shuai Gao, Ningde (CN); Shuting Sun, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/868,636

(22) Filed: Jul. 19, 2022

(65) Prior Publication Data
US 2023/0029223 A1  Jan. 26, 2023

Related U.S. Application Data

(63) Continuation of application No. PCT/CN2021/107850, filed on Jul. 22, 2021.

(51) Int. Cl.
*G01R 31/388* (2019.01)
*G01R 31/392* (2019.01)
*G01R 31/36* (2020.01)

(52) U.S. Cl.
CPC ....... *G01R 31/388* (2019.01); *G01R 31/3648* (2013.01); *G01R 31/392* (2019.01)

(58) Field of Classification Search
CPC .. G01R 31/382; G01R 31/388; G01R 31/392; G01R 31/3648; H02J 7/0048; B60L 3/12; B60L 50/64; G06F 3/0482; Y02T 10/70
(Continued)

(56) References Cited

U.S. PATENT DOCUMENTS 8,912,761 B2 * 12/2014 Izumi .................. G01R 31/392
324/426

FOREIGN PATENT DOCUMENTS

CN       02741699 A  * 10/2012  ......... G01R 31/3835
CN      102741699 A    10/2012
(Continued)

OTHER PUBLICATIONS

Contemporary Amperex Technology Co. Limited, International Search Report and Written Opinion, PCT/CN2021/107850, dated Apr. 2, 2022, 11 pgs.
(Continued)

*Primary Examiner* — Lee E Rodak
*Assistant Examiner* — Trung Q Nguyen
(74) *Attorney, Agent, or Firm* — XSENSUS LLP

(57) ABSTRACT

A method for determining a full-charge capacity of a battery pack includes: obtaining first state of charge values of cells at a first state of charge correction moment; calculating a net cumulative charge capacity from the first state of charge correction moment to a full-charge moment; obtaining a voltage-capacity curve of a fully charged cell from start of a charge termination phase to the full-charge moment; obtaining a second voltage of a not fully charged cell at the full-charge moment; obtaining a capacity difference between the not fully charged cell at the full-charge moment and the not fully charged cell at the first full-charge voltage; calculating a state of charge difference; calculating a second state of charge value of the not fully charged cell at the full-charge moment; obtaining state of charge variations; calculating full-charge capacities; and obtaining a full-charge capacity based on the calculated full-charge capacities.

11 Claims, 4 Drawing Sheets

(58) Field of Classification Search
USPC ............ 324/415, 437, 425–435, 76.11, 126, 324/756.05, 538, 200, 207.13, 233, 256, 324/500–530
See application file for complete search history.

(56) References Cited

FOREIGN PATENT DOCUMENTS

| | | |
|---|---|---|
| CN | 105353313 A | 2/2016 |
| CN | 110361668 A | 10/2019 |
| EP | 3106892 A1 | 12/2016 |
| JP | 2009052974 A | 3/2009 |

OTHER PUBLICATIONS

Contemporary Amperex Technology Co. Limited, Extended European Search Report, EP21908088.4, dated Dec. 20, 2022, 5 pgs.

* cited by examiner

METHOD FOR DETERMINING FULL-CHARGE CAPACITY OF BATTERY PACK, METHOD FOR DETERMINING STATE OF HEALTH OF BATTERY PACK, SYSTEM, AND APPARATUS

CROSS-REFERENCE TO RELATED APPLICATION

This application is a continuation application of PCT Patent Application No. PCT/CN2021/107850, entitled "METHOD FOR DETERMINING FULL-CHARGE CAPACITY OF BATTERY PACK, METHOD FOR DETERMINING STATE OF HEALTH OF BATTERY PACK, SYSTEM, AND APPARATUS" filed on Jul. 22, 2021, which is incorporated herein by reference in its entirety.

TECHNICAL FIELD

This application relates to the technical field of batteries, and in particular, to a method for determining a full-charge capacity of a battery pack, a method for determining a state of health of a battery pack, a battery management system, and an electric apparatus.

BACKGROUND

In the field of batteries, full-charge capacity (FCC) is usually used as a standard capacity to indicate an accurate remaining capacity of a battery. In this case, the remaining capacity represents a relative state of charge (RSOC) as a percentage of the full-charge capacity. The full-charge capacity represents the maximum chargeable capacity of the battery, and decreases during operation of the battery. This is mainly related to use duration, the number of charge and discharge cycles, an operating condition, and an environmental temperature of the battery. Therefore, when the battery is in use, it is necessary to correct the full-charge capacity of the battery.

At present, a full-charge capacity of a battery is usually obtained by dividing a variation of a charge and discharge capacity by a variation of a state of charge (SOC) of the battery. However, an SOC estimated in real time is not accurate enough. Therefore, it is necessary to determine an accurate SOC by using a static open circuit voltage (OCV) of the battery and an OCV-SOC curve after the battery is left to stand.

SUMMARY

This application is aware that at present, to obtain an accurate full-charge capacity, it is necessary to obtain two relatively accurate SOCs at at least two SOC correction opportunities, so as to obtain an SOC variation to estimate a full-charge capacity of a battery. In one aspect, for batteries of some types (for example, lithium iron phosphate batteries), an open circuit voltage-state of charge curve of a battery includes a quite broad flat area, and it is impossible to correct an SOC based on an OCV-SOC curve in the flat area. As a result, there are few opportunities to correct the SOC. In another aspect, in a battery pack, individual differences exist among batteries. When one battery is at an SOC correction opportunity, another battery may be in a flat area of an OCV-SOC curve. Therefore, it is impossible to estimate full-charge capacities of all batteries. There are few opportunities to update a full-charge capacity of the battery pack.

For the foregoing shortcomings of the prior art, this application is intended to provide a method for determining a full-charge capacity of a battery pack, a method for determining a state of health (SOH) of a battery pack, a battery management system (BMS), and an electric apparatus to provide more opportunities for correcting the full-charge capacity of the battery pack and improve a precision of the full-charge capacity of the battery pack.

To achieve the foregoing objectives, a first aspect of this application provides a method for determining a full-charge capacity of a battery pack, where the method includes:

obtaining first state of charge values of cells in a battery pack at a first state of charge correction moment;

calculating a net cumulative charge capacity from the first state of charge correction moment to a full-charge moment of the battery pack;

obtaining a voltage-capacity curve of voltage and real-time remaining capacity of a fully charged cell from a start moment of a charge termination phase to the full-charge moment, where the fully charged cell is a cell in the battery pack that reaches a first full-charge voltage at the full-charge moment;

obtaining a second voltage of a not fully charged cell in the battery pack other than the fully charged cell at the full-charge moment;

obtaining, based on the voltage-capacity curve and the second voltage of the not fully charged cell, a capacity difference between the not fully charged cell at the full-charge moment and the not fully charged cell at the first full-charge voltage;

calculating a state of charge difference between the not fully charged cell at the full-charge moment and the not fully charged cell at the first full-charge voltage by dividing the capacity difference of the not fully charged cell by an actual full-charge capacity of the not fully charged cell;

obtaining a second state of charge value of the fully charged cell at the full-charge moment;

calculating a second state of charge value of the not fully charged cell at the full-charge moment by subtracting the state of charge difference of the not fully charged cell from the second state of charge value of the fully charged cell;

obtaining a difference between the second state of charge value and the first state of charge value of the fully charged cell and a difference between the second state of charge value and the first state of charge value of the not fully charged cell, respectively as a state of charge variation of the fully charged cell and a state of charge variation of the not fully charged cell;

calculating full-charge capacities of the fully charged cell and the not fully charged cell by dividing the net cumulative charge capacity by the state of charge variations;

and obtaining a full-charge capacity of the battery pack based on the calculated full-charge capacities of the fully charged cell and the not fully charged cell.

In the foregoing embodiment, to obtain a relatively accurate SOC, an SOC at a state of charge correction moment is obtained. Specifically, an SOC of a battery is corrected at the first state of charge correction moment, and a relatively accurate lower SOC of the battery is obtained.

In addition, in the foregoing embodiment, characteristics of voltage curve forms are self-learned by comparing dynamic voltage curve forms of cells during charge, so that a relatively accurate higher SOC required for capacity estimation can be obtained for each cell in the battery pack based on a dynamic voltage. In this way, SOC variations of all cells can be obtained without leaving the battery to stand twice. In addition, SOC variations of some cells in an OCV-SOC flat area can also be calculated. Therefore, SOC variations of all cells can be calculated, full-charge capacities of all cells can be estimated, and more opportunities can be obtained to update the full-charge capacity of the battery pack when the cells are connected in series.

In an embodiment of this application, when the cells are connected in series, the step of obtaining the full-charge capacity of the battery pack includes: using a minimum capacity of the calculated full-charge capacities of the cells in the battery pack as the full-charge capacity of the battery pack. A person skilled in the art should understand that this embodiment is a preferred embodiment when the cells are connected in series. When the cells are connected in a different mode, the full-charge capacity of the battery pack can be determined based on the calculated full-charge capacities of the cells and the specific connection mode.

If the steps are stated in an order in this specification or the claims, this does not necessarily mean that the embodiment or aspect is limited to the stated order. Instead, it is conceivable that the steps are alternatively performed in a different order or in parallel with each other, unless one step depends on another step, which absolutely needs the dependent step to be subsequently performed (however this will become clear in an individual case). Thus, the stated order may be a preferred embodiment.

In some embodiments, static state of charge values of the cells in the battery pack are obtained based on static open circuit voltage-state of charge curves and voltages of the cells in the battery pack, where the voltages are obtained when the battery pack satisfies a standing condition, when a maximum of the static state of charge values of the cells in the battery pack is less than a preset state of charge threshold, the static state of charge values are the first state of charge values, and a moment at which the static state of charge values are obtained is the first state of charge correction moment.

In this embodiment, an SOC below a low-end SOC threshold is used as a first corrected SOC of a cell, and correction is performed only when a maximum SOC among all cells reaches the low-end SOC threshold. This ensures that all cells are below the low-end SOC threshold. In some embodiments, the low-end SOC threshold is within a low SOC range with a relatively large slope in OCV-SOC curves of the cells. In an embodiment, the low-end SOC threshold is 20%. By using the SOC below the low-end SOC threshold as the first corrected SOC of the cell, almost SOC differences within a full scale are measured. As a result, a precision of an obtained full-charge capacity is relatively high.

In addition, in some embodiments, a standing condition of the battery pack is that a current of the battery pack has been less than a current threshold for a time threshold, where the current threshold and the time threshold are obtained through actual tests. In an actual test, when the current is less than or equal to the current threshold, a voltage difference under the same SOC condition is within an allowed precision range. In an embodiment, the allowed precision range is 3 mV. In addition, in the actual test, when the current has been less than or equal to the current threshold for a specific period of time, a voltage no longer changes significantly with time. This period of time is the time threshold that satisfies the standing condition.

In some embodiments, the step of obtaining a capacity difference of the not fully charged cell includes:

obtaining a remaining capacity of the fully charged cell at the second voltage by substituting the second voltage of the not fully charged cell into the voltage-capacity curve; and obtaining the capacity difference of the not fully charged cell by subtracting the remaining capacity of the fully charged cell at the second voltage from a remaining capacity of the fully charged cell at the first full-charge voltage.

Because voltage-capacity curves of the cells are nearly the same at a charge termination phase, a capacity difference of the not fully charged cell between two voltages is similar to a capacity difference of the fully charged cell between the same two voltages. Then, the state of charge difference between the not fully charged cell at the full-charge moment (a voltage of the not fully charged cell is below the first full-charge voltage at this moment) and the not fully charged cell at the first full-charge voltage can be calculated by dividing the capacity difference by the actual full-charge capacity of the not fully charged cell. As described above, the relatively accurate second state of charge value of the not fully charged cell can be calculated based on the state of charge difference.

In some embodiments, the method includes updating an actual full-charge capacity of a cell in the battery pack to a calculated full-charge capacity of the cell.

In some embodiments, a cell in the battery pack satisfies a condition of the charge termination phase when a voltage of the cell exceeds a preset voltage threshold. An implementation of determining whether a cell is at a charge termination phase based on a voltage is relatively simple and can save computing resources.

In other embodiments, a cell in the battery pack satisfies a condition of the charge termination phase when a voltage change rate of the cell varying with time or state of charge exceeds a preset voltage change rate threshold.

In some embodiments, the net cumulative charge capacity is calculated based on an ampere hour integral method.

In some embodiments, a real-time remaining capacity of the fully charged cell is calculated in real time based on the ampere hour integral method and a corrected full-charge capacity obtained in previous correction of the full-charge capacity of the fully charged cell.

A second aspect of this application provides a method for determining a state of health of a battery pack, where the method includes:

obtaining a state of health of a battery pack by dividing a current full-charge capacity of the battery pack determined according to the method for determining a full-charge capacity of a battery pack according to the first aspect by a preset capacity of the battery pack.

A third aspect of this application provides a battery management system, where the battery management system includes:

at least one processor; and a memory connected to the at least one processor, where the memory stores an instruction, and when the instruction is executed by the at least one processor, the instruction causes the at least one processor to execute the method for determining a full-charge capacity of a battery pack according to the first aspect and/or the method for determining a state of health of a battery pack according to the second aspect.

A fourth aspect of this application provides an electric apparatus, where the electric apparatus includes a battery pack, and the battery management system according to the third aspect. The battery may be used as a power source of the apparatus or an energy storage unit of the apparatus. The apparatus may be, but is not limited to, a mobile device (for example, a mobile phone or a notebook computer), an electric vehicle (for example, a battery electric vehicle, a hybrid electric vehicle, a plug-in hybrid electric vehicle, an electric bicycle, an electric scooter, an electric golf vehicle, or an electric truck), an electric train, a ship, a satellite, an energy storage system, and the like. A battery may be selected for the apparatus according to requirements for using the apparatus.

BRIEF DESCRIPTION OF DRAWINGS

To describe the technical solutions in this application more clearly, the following briefly describes the accompanying drawings required for describing the embodiments of this application. Apparently, the accompanying drawings in the following description show merely some embodiments of this application, and a person of ordinary skill in the art may still derive other drawings from the accompanying drawings without creative efforts.

DETAILED DESCRIPTION OF EMBODIMENTS

The following describes the embodiments of this application in detail with reference to the accompanying drawings.

Figure 1:
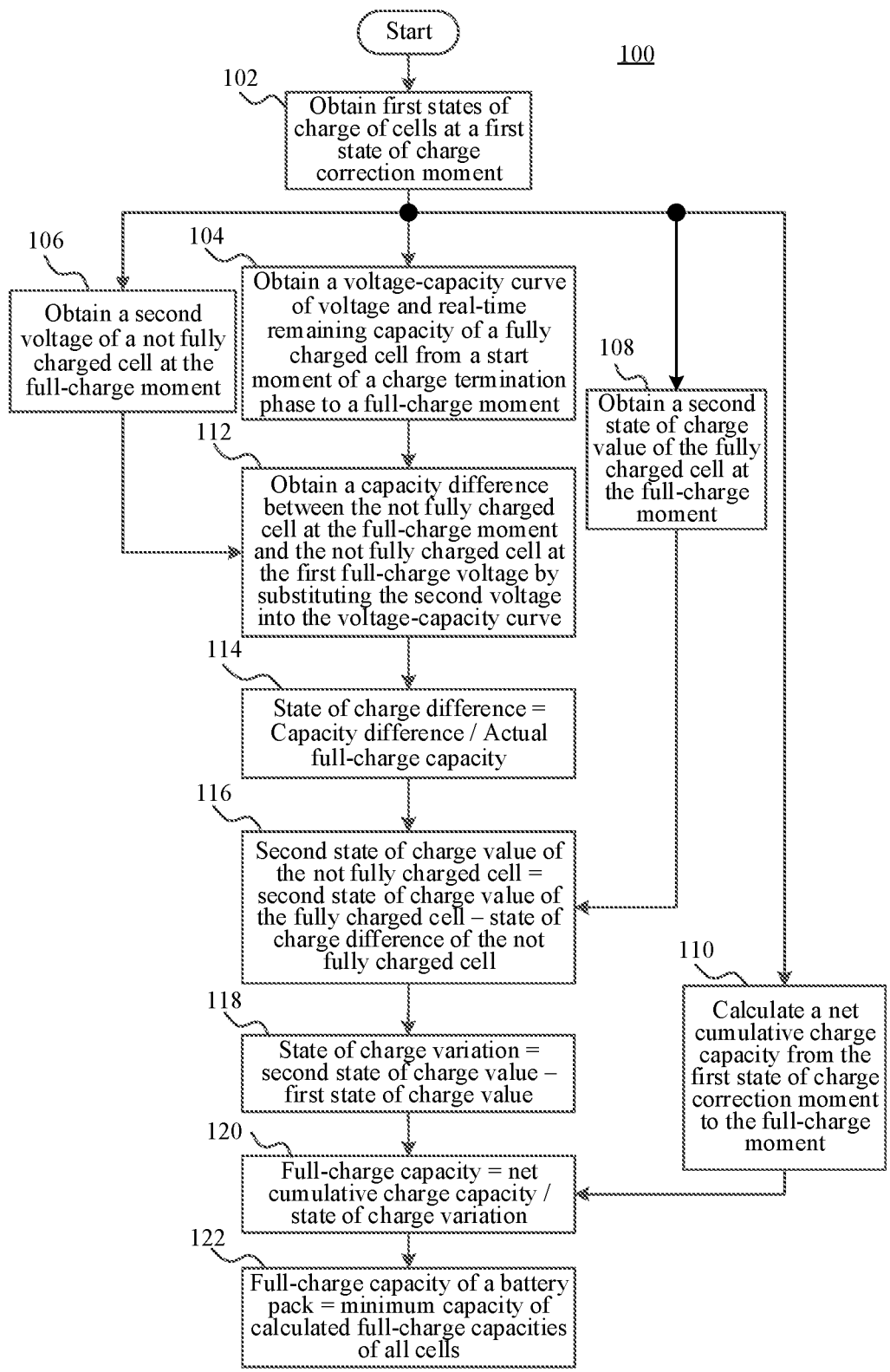
FIG. 1 is a flowchart of a method for determining a full-charge capacity of a battery pack according to an embodiment of this application.
Figure 2:
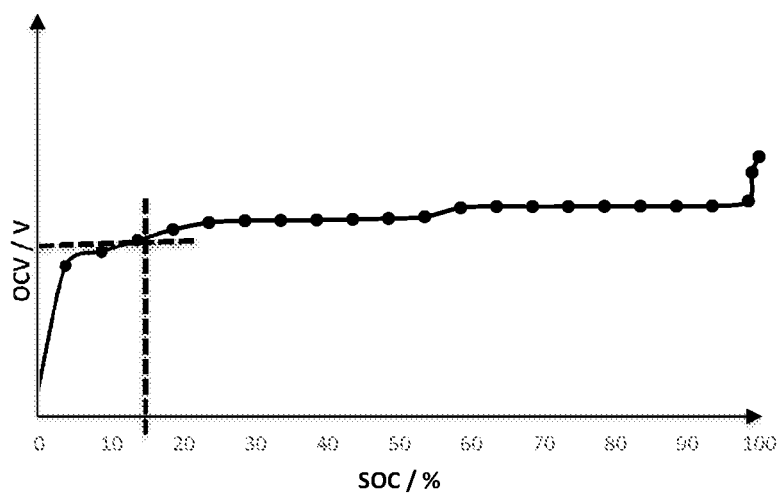
FIG. 2 is a schematic diagram of a static OCV-SOC curve of a lithium iron phosphate battery according to an embodiment of this application.

FIG. 1 is a flowchart of a method for determining a full-charge capacity of a battery pack according to an embodiment of this application. As shown in FIG. 1, in Step 102, a first state of charge value of each cell in a battery pack at a first state of charge correction moment is obtained. In some embodiments of this application, the first state of charge value of the cell is corrected in a low-end SOC area. When an SOC is corrected based on an open circuit voltage method, it is required to perform correction within a segment where a static OCV-SOC curve has a specific slope. This is because when a slope of a static OCV-SOC curve approaches zero, a voltage may correspond to a relatively large SOC range, and a voltage error caused by a voltage sampling error or another reason may cause the SOC to fluctuate significantly. As a result, accuracy of the SOC obtained in this way is too low. A lithium iron phosphate battery is used as an example. Further referring to FIG. 2, a static OCV-SOC curve of the lithium iron phosphate battery has two relatively broad flat areas within a range of 30% to 80%. As described above, an SOC cannot be corrected based on the open circuit voltage method in the flat areas.

However, after the battery is discharged to a relatively low SOC, a slope of the OCV-SOC curve is not that flat any more. The SOC can be corrected based on the open circuit voltage method. During charge and discharge, flowing of a current through the battery may cause a concentration of an ion near an electrode to change with an electrode reaction. A speed of scattering of ions in a bulk solution of the battery is not high enough to catch up with this change. This leads to a concentration difference gradient of one concentration gradient ion between an ion concentration of a solution close to the electrode and an ion concentration of the bulk solution of the battery, which makes an electrode potential deviate from an equilibrium electrode potential and causes polarization to the battery. That is, overpotential is generated at positive and negative electrodes of the battery, causing a voltage of the battery to deviate from an actual voltage. Such concentration difference can be eliminated through standing to restore the electrode to the equilibrium potential.

Specifically, in some embodiments of this application, when a current of the battery has been less than a current threshold for a time threshold, the battery is completely depolarized and a standing condition is satisfied. In this case, a static voltage value of each cell in the battery pack is obtained, and an SOC of each cell is determined based on an OCV-SOC curve in FIG. 2. The SOC of each cell is not corrected based on the SOC obtained based on the OCV-SOC curve until SOCs of all cells are in a low-end area with a relatively large slope in the OCV-SOC curve. In an embodiment, a low-end SOC threshold of the low-end area with a relatively large slope is 20%.

It should be understood that correcting the first state of charge values of the cells in the battery pack within the low-end SOC area is a preferred embodiment of this application. A person skilled in the art may figure out using an SOC value corrected at another SOC correction opportunity as the first state of charge value. For example, in some embodiments, the first state of charge correction moment may be selected within an area with a relatively large slope between two flat areas of the OCV-SOC curve. In some embodiments, the first state of charge correction moment is selected within an area with a slope of more than 3 mV voltage change per 1% SOC change between two flat areas of the OCV-SOC curve.

In Step 104, a voltage-capacity curve of voltage and real-time remaining capacity of a fully charged cell from a start moment of a charge termination phase to a full-charge moment is obtained, where the fully charged cell is a cell in the battery pack that reaches a first full-charge voltage at the full-charge moment. In some embodiments, the first full-charge voltage is a constant value obtained through offline roll tests. In addition, in some embodiments, a real-time remaining capacity of the fully charged cell is calculated in real time based on an ampere hour integral method and a corrected full-charge capacity obtained in previous correction of the full-charge capacity of the fully charged cell. A voltage-capacity curve may be obtained based on the calculated real-time remaining capacity and a measured voltage. Such a voltage-capacity curve is shown as a curve in FIG. 3. In some embodiments, each cell satisfies a condition of the charge termination phase when a voltage of the cell exceeds a preset voltage threshold. In other embodiments, each cell satisfies a condition of the charge termination phase when a voltage change rate of the cell varying with time or state of charge exceeds a preset voltage change rate threshold.

Figure 3:
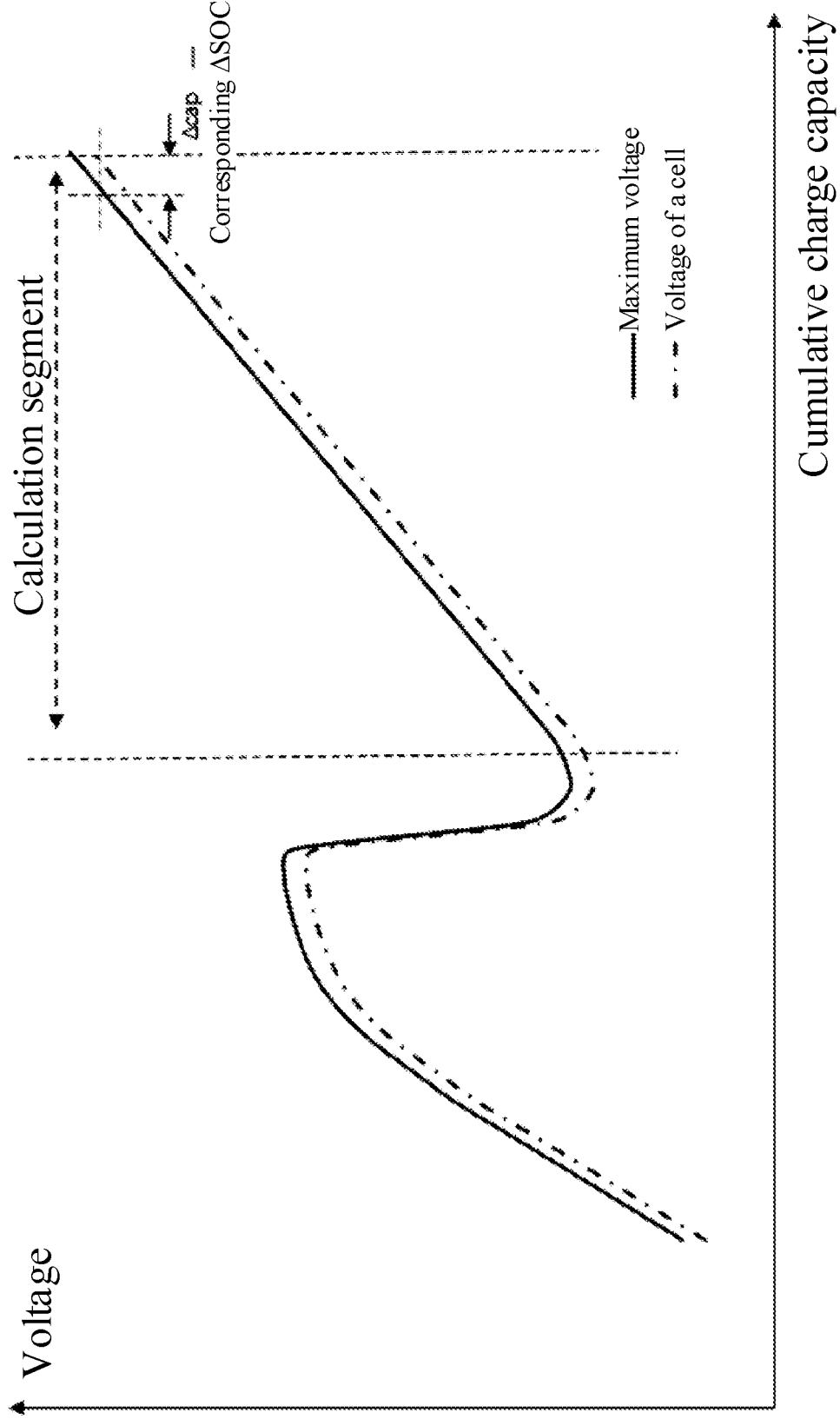
FIG. 3 is a schematic diagram of a voltage-capacity curve for calculating an SOC difference at a full-charge moment according to an embodiment of this application.

As shown in FIG. 3, because of individual differences between cells, voltages of cells connected in series are different after the cells are charged a same cumulative capacity. The method shown in FIG. 1 takes advantage of this characteristic that waveforms are similar. In Step 106, a second voltage of a not fully charged cell in the battery pack other than the fully charged cell at the full-charge moment is obtained. In Step 108, a second state of charge value of the fully charged cell at the full-charge moment is obtained. In Step 110, a net cumulative charge capacity from the first state of charge correction moment to the full-charge moment of the battery pack is calculated, where the net cumulative charge capacity equals a cumulative charge capacity during charge minus a cumulative discharge capacity during discharge. Specifically, the net cumulative charge capacity is calculated based on an ampere hour integral method. That is, the cumulative charge capacity during charge is a time integration of a charge current, and the cumulative discharge capacity during discharge is a time integration of a discharge current. A person skilled in the art should understand that Steps 104 to 110 may be performed at the same time or performed sequentially according to a different order.

In Step 112, a capacity difference between each not fully charged cell at the full-charge moment and the not fully charged cell at the first full-charge voltage is obtained by substituting the second voltage of the not fully charged cell into the voltage-capacity curve.

Specifically, referring to FIG. 3 again, a solid line is a voltage-capacity curve of a fully charged cell at a charge termination phase, and a dot dash line is a voltage-capacity curve of a not fully charged cell at the charge termination phase. The two curves have similar form features. Therefore, a remaining capacity of the fully charged cell at the second voltage may be obtained by substituting the second voltage of the not fully charged cell into the voltage-capacity curve, and the capacity difference of the fully charged cell may be obtained by subtracting the remaining capacity of the fully charged cell at the second voltage from the remaining capacity of the fully charged cell at the first full-charge voltage. This capacity difference is almost equal to a corresponding capacity difference of the not fully charged cell. In Step 114, a state of charge difference between each not fully charged cell at the full-charge moment and the not fully charged cell at the first full-charge voltage is calculated by dividing the capacity difference of the not fully charged cell by an actual full-charge capacity of the not fully charged cell.

Then, in Step 116, a second state of charge value of each not fully charged cell at the full-charge moment is calculated by subtracting the state of charge difference of the not fully charged cell from the second state of charge value of the fully charged cell.

In Step 118, a difference between a second state of charge value and a first state of charge value of each cell in the battery pack is obtained and used as a state of charge variation of the cell.

In Step 120, a full-charge capacity of each cell is calculated by dividing the net cumulative charge capacity by the state of charge variation of the cell.

When the cells are connected in series, in Step 122, a minimum capacity of calculated full-charge capacities of all cells in the battery pack is used as the full-charge capacity of the battery pack.

The method shown in FIG. 1 takes advantage of the characteristic that voltage-capacity curves of cells at the charge termination phase are similar in form, so that a SOC variation of each cell in the battery pack that corresponds to a voltage difference between a dynamic voltage and a full-charge voltage may be obtained based on the dynamic voltage. Thereby, another relatively accurate SOC may be obtained, that is, a larger SOC necessary for estimating a full-charge capacity. Therefore, first, a difference between two relatively accurate SOCs can be obtained without leaving the battery pack to stand twice. Second, for some cells in an OCV-SOC flat area, a difference between two relatively accurate SOCs can also be calculated. Therefore, a difference between two relatively accurate SOCs of all cells can be calculated. Thereby, full-charge capacities of all cells can be estimated. In addition, when the cells are connected in series, this method can be used to obtain more opportunities to update the full-charge capacity of the battery pack.

In some embodiments, the method for determining a full-charge capacity of a battery pack may further include: updating an actual full-charge capacity of each cell by using a calculated full-charge capacity of the cell.

Figure 4:
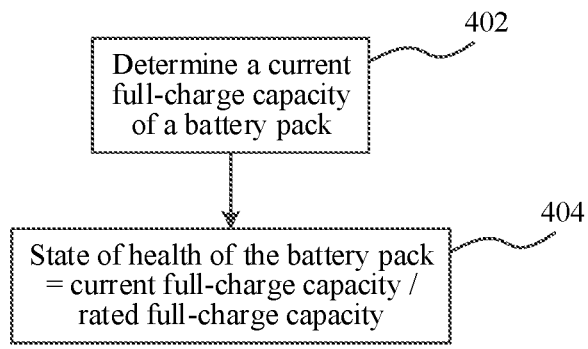
FIG. 4 is a flowchart of a method for determining a state of health of a battery pack according to an embodiment of this application.

FIG. 4 is a flowchart of a method for determining a state of health of a battery pack according to an embodiment of this application. As shown in FIG. 4, in Step 402, a current full-charge capacity of a battery pack is determined according to the method described in FIG. 1. Then, in Step 404, a state of health of the battery pack is obtained by dividing the current full-charge capacity by a preset capacity of the battery pack.

Figure 5:
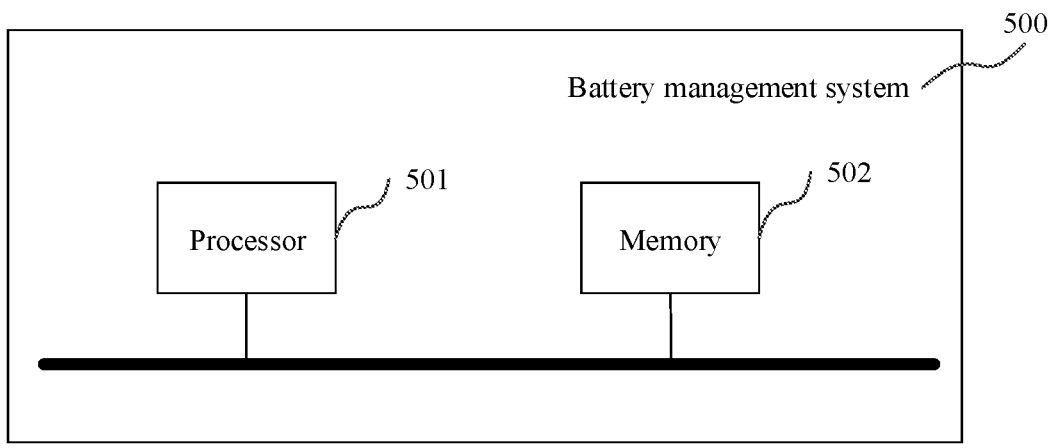
FIG. 5 is a schematic diagram of a battery management system according to an embodiment of this application.

Based on the same inventive concept, referring to FIG. 5, an embodiment of this application further provides a battery management system 500, including at least one processor 501 and a memory 502 that is communicatively connected to the processor 501. The memory 502 stores an instruction that can be executed by a processor, and when executed by the processor 501, the instruction makes the processor 501 perform the method for correcting a state of charge of a battery provided in the embodiments of this application.

The processor 501 and the memory 502 may be electrically connected directly or indirectly to implement data transmission or interaction. For example, these elements may be electrically connected by using one or more communication buses or signal buses. The method for correcting a state of charge of a battery includes at least one software functional module that may be stored in the memory 502 in a form of software or firmware (firmware).

The processor 501 may be an integrated circuit chip with a signal processing capability. The processor 501 may be a general-purpose processor, including a central processing unit (CPU), a network processor (NP), and the like; or a digital signal processor, an application specific integrated circuit, a field-programmable gate array or another programmable logic device, a discrete gate or transistor logic device, or a discrete hardware assembly. The processor 501 can implement or perform the methods, steps, and logic block diagrams disclosed in the embodiments of this application. The general-purpose processor may be a microprocessor or any regular processor.

The memory 502 may store various software programs and modules, such as a program instruction or module corresponding to the method for correcting a state of charge of a battery and the apparatus provided in the embodiments of this application. The processor 501 performs various function application and data processing, that is, implements the methods in the embodiments of this application, by running the software programs and modules stored in the memory 502.

The memory 502 may include, but is not limited to, a random access memory (RAM), a read only memory (ROM), a programmable read-only memory (PROM), an electric erasable programmable read-only memory (EE-PROM), and the like.

The implementations and specific embodiments in the foregoing method for correcting a state of charge of a battery are similarly applicable to the battery management system 500 shown in FIG. 5. From the detailed descriptions of the foregoing method for correcting a state of charge of a battery, a person skilled in the art can clearly know an implementation of the battery management system 500 in FIG. 5. Therefore, for brevity of this specification, details are not described herein again.

In addition, this application further provides an apparatus. The apparatus includes a battery and a battery management system as shown in FIG. 5. The battery may be used as a power source of the apparatus or an energy storage unit of the apparatus. The apparatus may be, but is not limited to, a mobile device (for example, a mobile phone or a notebook computer), an electric vehicle (for example, a battery electric vehicle, a hybrid electric vehicle, a plug-in hybrid electric vehicle, an electric bicycle, an electric scooter, an electric golf vehicle, or an electric truck), an electric train, a ship, a satellite, an energy storage system, and the like. A battery may be selected for the apparatus according to requirements for using the apparatus.

Figure 6:
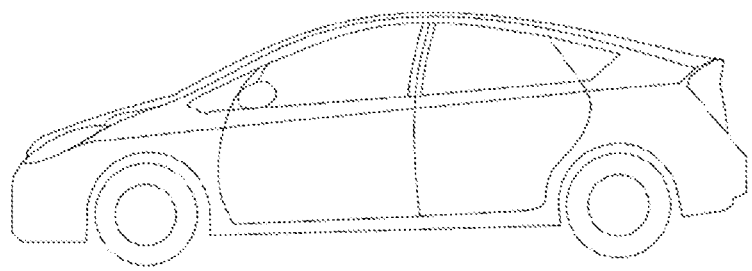
FIG. 6 is a schematic diagram of an electric apparatus containing a battery management system according to an embodiment of this application.

FIG. 6 shows an apparatus used as an example. The apparatus is a battery electric vehicle, a hybrid electric vehicle, a plug-in hybrid electric vehicle, or the like. In another example, the apparatus may be a mobile phone, a tablet computer, a notebook computer, or the like.

Although this application has been described with reference to the preferred embodiments, various modifications can be made to this application without departing from the scope of this application and the components therein can be replaced with equivalents. In particular, as long as there is no structural conflict, the various technical features mentioned in the embodiments can be combined in any manner. This application is not limited to the specific embodiments disclosed in this specification, but includes all technical solutions falling within the scope of the claims.

What is claimed is:

1. A method for charging a battery pack, the method comprising:
performing charging of the battery pack;
determining that the battery pack is in a charge termination phase based on a full-charge capacity of the battery pack; and
terminating the charging of the battery pack;
wherein the full-charge capacity of the battery pack is determined based on following steps:
establishing a connection between a battery management system and the battery pack through a communication bus of the battery management system;
obtaining, via the connection between the battery management system and the battery pack, a first state of charge values of cells in the battery pack at a first state of charge correction moment;
calculating a net cumulative charge capacity from the first state of charge correction moment to a full-charge moment of the battery pack;
obtaining a voltage-capacity curve of voltage and real-time remaining capacity of a fully charged cell from a start moment of a charge termination phase to the full-charge moment, wherein the fully charged cell is a cell in the battery pack that reaches a first full-charge voltage at the full-charge moment;
obtaining, via the connection between the battery management system and the battery pack, a second voltage of a not fully charged cell in the battery pack other than the fully charged cell at the full-charge moment;
obtaining, based on the voltage-capacity curve and the second voltage of the not fully charged cell, a capacity difference between the not fully charged cell at the full-charge moment and the not fully charged cell at the first full-charge voltage;
calculating a state of charge difference between the not fully charged cell at the full-charge moment and the not fully charged cell at the first full-charge voltage by dividing the capacity difference of the not fully charged cell by an actual full-charge capacity of the not fully charged cell;
obtaining a second state of charge value of the fully charged cell at the full-charge moment;
calculating a second state of charge value of the not fully charged cell at the full-charge moment by subtracting the state of charge difference of the not fully charged cell from the second state of charge value of the fully charged cell;
obtaining a difference between the second state of charge value and the first state of charge value of the fully charged cell and a difference between the second state of charge value and the first state of charge value of the not fully charged cell, respectively as a state of charge variation of the fully charged cell and a state of charge variation of the not fully charged cell;
calculating full-charge capacities of the fully charged cell and the not fully charged cell by dividing the net cumulative charge capacity by the state of charge variations; and
obtaining a full-charge capacity of the battery pack based on the calculated full-charge capacities of the fully charged cell and the not fully charged cell.

2. The method according to claim 1, wherein static state of charge values of the cells in the battery pack are obtained based on static open circuit voltage-state of charge curves and voltages of the cells in the battery pack, wherein the voltages are obtained when the battery pack satisfies a standing condition, when a maximum of the static state of charge values of the cells in the battery pack is less than a preset state of charge threshold, the static state of charge values are the first state of charge values, and a moment at which the static state of charge values are obtained is the first state of charge correction moment.

3. The method according to claim 1, wherein the step of obtaining a capacity difference of the not fully charged cell comprises:
obtaining a remaining capacity of the fully charged cell at the second voltage by substituting the second voltage of the not fully charged cell into the voltage-capacity curve; and
obtaining the capacity difference of the not fully charged cell by subtracting the remaining capacity of the fully charged cell at the second voltage from a remaining capacity of the fully charged cell at the first full-charge voltage.

4. The method according to claim 1, wherein the method comprises:
updating an actual full-charge capacity of a cell in the battery pack to a calculated full-charge capacity of the cell.

5. The method according to claim 1, wherein a cell in the battery pack satisfies a condition of the charge termination phase when a voltage of the cell exceeds a preset voltage threshold.

6. The method according to claim 1, wherein a cell in the battery pack satisfies a condition of the charge termination phase when a voltage change rate of the cell varying with time or state of charge exceeds a preset voltage change rate threshold.

7. The method according to claim 1, wherein the net cumulative charge capacity is calculated based on an ampere hour integral method.

8. The method according to claim 1, wherein a real-time remaining capacity of the fully charged cell is calculated in real time based on an ampere hour integral method and a corrected full-charge capacity obtained in previous correction of the full-charge capacity of the fully charged cell.

9. The method according to claim 1, wherein the method comprises:
obtaining a state of health of the battery pack by dividing the full-charge capacity of the battery pack by a preset capacity of the battery pack.

10. A battery management system communicatively connected with a battery pack, the battery management system comprising:
a communication bus;
at least one processor; and
a memory connected to the at least one processor, wherein the memory stores an instruction that, when executed by the at least one processor, causes the at least one processor to perform operations for determining a full-charge capacity of the battery pack, the operations including:
establishing a connection between the battery management system and the battery pack, which is charging, through the communication bus of the battery management system;
obtaining, via the connection between the battery management system and the battery pack, a first state of charge values of cells in the battery pack at a first state of charge correction moment;
calculating a net cumulative charge capacity from the first state of charge correction moment to a full-charge moment of the battery pack;
obtaining a voltage-capacity curve of voltage and real-time remaining capacity of a fully charged cell from a start moment of a charge termination phase to the full-charge moment, wherein the fully charged cell is a cell in the battery pack that reaches a first full-charge voltage at the full-charge moment;
obtaining, via the connection between the battery management system and the battery pack, a second voltage of a not fully charged cell in the battery pack other than the fully charged cell at the full-charge moment;
obtaining, based on the voltage-capacity curve and the second voltage of the not fully charged cell, a capacity difference between the not fully charged cell at the full-charge moment and the not fully charged cell at the first full-charge voltage;
calculating a state of charge difference between the not fully charged cell at the full-charge moment and the not fully charged cell at the first full-charge voltage by dividing the capacity difference of the not fully charged cell by an actual full-charge capacity of the not fully charged cell;
obtaining a second state of charge value of the fully charged cell at the full-charge moment;
calculating a second state of charge value of the not fully charged cell at the full-charge moment by subtracting the state of charge difference of the not fully charged cell from the second state of charge value of the fully charged cell;
obtaining a difference between the second state of charge value and the first state of charge value of the fully charged cell and a difference between the second state of charge value and the first state of charge value of the not fully charged cell, respectively as a state of charge variation of the fully charged cell and a state of charge variation of the not fully charged cell;
calculating full-charge capacities of the fully charged cell and the not fully charged cell by dividing the net cumulative charge capacity by the state of charge variations;
obtaining a full-charge capacity of the battery pack based on the calculated full-charge capacities of the fully charged cell and the not fully charged cell;
determining that the battery pack is in a charge termination phase based on the full-charge capacity of the battery back, and
terminating the charging of the battery pack.

11. An electric apparatus, comprising:
a battery pack; and
a battery management system communicatively connected with the battery pack, the battery management system having a communication bus, at least one processor, and a memory connected to the at least one processor, the memory storing an instruction that, when executed by the at least one processor, causes the at least one processor to perform operations for determining a full-charge capacity of the battery pack, the operations including:
establishing a connection between the battery management system and the battery pack, which is charging, through the communication bus of the battery management system;
obtaining, via the connection between the battery management system and the battery pack, a first state of charge values of cells in the battery pack at a first state of charge correction moment;
calculating a net cumulative charge capacity from the first state of charge correction moment to a full-charge moment of the battery pack;
obtaining a voltage-capacity curve of voltage and real-time remaining capacity of a fully charged cell from a start moment of a charge termination phase to the full-charge moment, wherein the fully charged cell is a cell in the battery pack that reaches a first full-charge voltage at the full-charge moment;
obtaining, via the connection between the battery management system and the battery pack, a second voltage of a not fully charged cell in the battery pack other than the fully charged cell at the full-charge moment;
obtaining, based on the voltage-capacity curve and the second voltage of the not fully charged cell, a capacity difference between the not fully charged cell at the full-charge moment and the not fully charged cell at the first full-charge voltage;
calculating a state of charge difference between the not fully charged cell at the full-charge moment and the not fully charged cell at the first full-charge voltage by dividing the capacity difference of the not fully charged cell by an actual full-charge capacity of the not fully charged cell;
obtaining a second state of charge value of the fully charged cell at the full-charge moment;
calculating a second state of charge value of the not fully charged cell at the full-charge moment by subtracting the state of charge difference of the not fully charged cell from the second state of charge value of the fully charged cell;

obtaining a difference between the second state of charge value and the first state of charge value of the fully charged cell and a difference between the second state of charge value and the first state of charge value of the not fully charged cell, respectively as a state of charge variation of the fully charged cell and a state of charge variation of the not fully charged cell;

calculating full-charge capacities of the fully charged cell and the not fully charged cell by dividing the net cumulative charge capacity by the state of charge variations;

obtaining a full-charge capacity of the battery pack based on the calculated full-charge capacities of the fully charged cell and the not fully charged cell;

determining that the battery pack is in a charge termination phase based on the full-charge capacity of the battery back; and terminating the charging of the battery pack.

\* \* \* \* \*